United States Patent

Hashimoto

(10) Patent No.: US 9,165,806 B2
(45) Date of Patent: Oct. 20, 2015

(54) SUBSTRATE TREATMENT APPARATUS

(75) Inventor: Koji Hashimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 821 days.

(21) Appl. No.: 12/880,636

(22) Filed: Sep. 13, 2010

(65) Prior Publication Data

US 2011/0073040 A1  Mar. 31, 2011

(30) Foreign Application Priority Data

Sep. 30, 2009  (JP) ................... 2009-226263

(51) Int. Cl.
B05C 11/00 (2006.01)
C23C 16/00 (2006.01)
H01L 21/67 (2006.01)

(52) U.S. Cl.
CPC ...... *H01L 21/6719* (2013.01); *H01L 21/67017* (2013.01); *H01L 21/67126* (2013.01)

(58) Field of Classification Search
None
See application file for complete search history.

(56) References Cited

U.S. PATENT DOCUMENTS

| 6,004,631 A | 12/1999 | Mori | |
|---|---|---|---|
| 2002/0041935 A1* | 4/2002 | Inada et al. | 427/421 |
| 2003/0010671 A1* | 1/2003 | Orii et al. | 206/710 |
| 2003/0172955 A1 | 9/2003 | Kuroda et al. | |
| 2007/0264840 A1 | 11/2007 | Itatani et al. | |
| 2008/0135177 A1 | 6/2008 | Kim | |
| 2008/0175999 A1* | 7/2008 | Kawaji et al. | 427/444 |
| 2009/0064934 A1 | 3/2009 | Park et al. | |

FOREIGN PATENT DOCUMENTS

| JP | 63-073626 | 4/1988 |
|---|---|---|
| JP | 11-87294 | 3/1999 |
| JP | 2001-156032 | 6/2001 |
| JP | 2002-184739 | 6/2002 |
| JP | 2003-282514 | 10/2003 |
| JP | 2006-202983 | 8/2006 |
| JP | 2007-103956 | 4/2007 |
| JP | 2009-135396 | 6/2009 |
| KR | 2001-0104572 | 11/2001 |
| KR | 10-0375080 | 5/2003 |
| KR | 10-2008-0053167 | 6/2008 |

OTHER PUBLICATIONS

Korean Office Action issued Aug. 30, 2011 in connection with corresponding Korean Patent Application No. 10-2010-0085374.

* cited by examiner

*Primary Examiner* — Charles Capozzi
(74) *Attorney, Agent, or Firm* — Ostrolenk Faber LLP (57) ABSTRACT

A substrate treatment apparatus includes: a treatment chamber in which a substrate is treated; a substrate holding unit which holds the substrate in the treatment chamber; a shield member disposed above the substrate holding unit and having an opposing surface to be brought into opposed relation to the substrate holding unit; and a gas supply portion which has a downward gas supply port having an annular shape to surround the shield member as seen in plan and is disposed on an upper portion of the treatment chamber for supplying a gas into the treatment chamber.

8 Claims, 7 Drawing Sheets

SUBSTRATE TREATMENT APPARATUS

BACKGROUND OF THE INVENTION

1. Field of the Invention

The present invention relates to a substrate treatment apparatus which treats a substrate such as a semiconductor wafer, a glass substrate for a liquid crystal display device, a substrate for a plasma display device, a substrate for a FED (Field Emission Display) device, a substrate for an optical disk, a substrate for a magnetic disk, a substrate for a magneto-optical disk, and a substrate for a photo mask.

2. Description of Related Art

In production processes for semiconductor devices and liquid crystal display devices, a substrate such as a semiconductor wafer or a glass substrate for a liquid crystal display panel is treated with a treatment liquid and a treatment gas. For example, a substrate treatment apparatus of a single substrate treatment type adapted to treat a single substrate at a time includes a spin chuck which horizontally holds and rotates the substrate, a nozzle which supplies the treatment liquid to a surface of the substrate held by the spin chuck, and a bottomed tubular treatment cup in which the spin chuck is accommodated. The spin chuck, the nozzle and the treatment cup are accommodated in a treatment chamber.

During the treatment of the substrate, an upward gas current occurs around the spin chuck due to the rotation of the substrate and the spin chuck. The upward gas current causes the mist of the treatment liquid to soar and spread in the treatment chamber, so that the interior wall of the treatment chamber and components disposed in the treatment chamber are contaminated with the mist of the treatment liquid. If the mist of the treatment liquid is dried in the treatment chamber, particles resulting from the dried treatment liquid float in the atmosphere, leading to contamination of a substrate to be subsequently treated. To cope with this, an FFU (fan filter unit) is provided at the center of a ceiling of the treatment chamber. A downward gas current is produced in the treatment cup by supplying clean air downward from a gas supply port of the FFU and venting the air from a gas outlet port provided in a bottom of the treatment cup.

In order to suppress the soaring of the treatment liquid mist and the like in a space of the treatment chamber outside the treatment cup, the internal atmosphere of the treatment chamber is vented through a gas outlet port provided in a bottom of the treatment chamber to produce a downward gas current toward the gas outlet port, whereby the ventilation of the internal atmosphere of the treatment chamber is promoted.

Further, a shield member is provided, for example, in opposed relation to the surface (upper surface) of the substrate held by the spin chuck in the treatment chamber for shielding a space above the surface of the substrate from the ambient atmosphere (see, for example, Japanese Unexamined Patent Publication No. 2006-202983).

With the gas supply port of the FFU disposed above the shield member, however, the shield member prevents the flow of the clean air to disturb the gas current in the treatment chamber. Therefore, the convection of the atmosphere is liable to occur in the treatment chamber. Particularly, during the rotation of the spin chuck, the upward gas current described above is liable to disturb the gas current in the treatment chamber. This is a major factor that makes it difficult to stably produce the downward gas current in the space of the treatment chamber outside the treatment cup.

In order to stabilize the gas current in the treatment chamber and promote the ventilation of the internal atmosphere of the treatment chamber, a higher gas venting capability is required to vent the air from the gas outlet port provided in the bottom of the treatment chamber. However, a plant in which the substrate treatment apparatus is installed has a limitation in available gas venting capacity, making it difficult to provide a gas venting capability necessary for stabilization of the gas current.

SUMMARY OF THE INVENTION

It is therefore an object of the present invention to provide a substrate treatment apparatus which is capable of properly venting the internal atmosphere of a treatment chamber and does not require a higher gas venting capability for ventilation from a gas outlet port.

A substrate treatment apparatus according to the present invention includes: a treatment chamber in which a substrate is treated; a substrate holding unit which holds the substrate in the treatment chamber; a shield member disposed above the substrate holding unit and having an opposing surface to be brought into opposed relation to the substrate holding unit; and a gas supply portion which has a downward gas supply port having an annular shape to surround the shield member as seen in plan and is disposed on an upper portion of the treatment chamber for supplying a gas into the treatment chamber.

With this arrangement, the gas supply port has an annular shape to surround the shield member as seen in plan. Since the gas is supplied downward from the gas supply port in the treatment chamber, an annular downward gas current is produced as surrounding the shield member in the treatment chamber. Therefore, the downward gas current is substantially free from interference with the shield member. This suppresses the convection of the internal atmosphere of the treatment chamber, thereby stabilizing the gas current. Thus, the internal atmosphere of the treatment chamber can be efficiently vented.

Where the treatment chamber is surrounded by a hollow cylindrical partition wall having a cylindrical surface having a predetermined vertical center axis, the gas supply port may have an annular shape.

The substrate treatment apparatus may further include a lift unit which moves up and down the shield member between a treatment position at which the opposing surface is opposed to and spaced a minute distance from a front surface of the substrate and a spaced-apart position at which the opposing surface is spaced (upward) apart from the front surface of the substrate, and the gas supply port may be provided in the same plane as the opposing surface of the shield member located at the spaced-apart position.

With this arrangement, the shield member is located at the treatment position when the front surface of the substrate is treated with the use of the shield member, and is located at the spaced-apart position when the front surface of the substrate is not treated with the use of the shield member. With the shield member located at the spaced-apart position, the gas supply port is present in the same plane as the opposing surface of the shield member. Therefore, the gas supplied from the gas supply port into the treatment chamber is free from interference with the shield member. This particularly stabilizes the gas current in the treatment chamber when the substrate is not treated with the use of the shield member.

The shield member may be supported by a shield member supporting member disposed outside the treatment chamber. In the treatment chamber, the gas supply port has an annular shape to surround the shield member as seen in plan. In other words, the gas supply port is not present just above the shield member in the treatment chamber. This makes it possible to utilize a space above the shield member in the treatment chamber, so that the shield member supporting member disposed outside the treatment chamber can support the shield member. In this case, an arrangement for driving the shield member and/or an arrangement for supporting the shield member can be disposed outside the treatment chamber. This allows for size reduction of the treatment chamber.

The treatment chamber may have a gas outlet port surrounding the substrate holding unit for introducing the internal atmosphere of the treatment chamber into a gas outlet pipe connected to the treatment chamber.

With this arrangement, the gas outlet port surrounds the substrate holding unit. Further, the gas supply port has an annular shape to surround the shield member as seen in plan. Since the shield member is disposed in opposed relation to the substrate holding member, the gas supply port and the gas outlet port overlap each other as seen in plan. Therefore, the annular downward gas current is stably produced in the treatment chamber. This reliably suppresses the interference between the downward gas current and the shield member.

The gas outlet port may have an annular shape to surround the substrate holding unit, or may include a plurality of gas outlet ports provided in spaced relation in an annular region surrounding the substrate holding unit.

The substrate treatment apparatus may further include a tubular treatment cup which surrounds the substrate holding unit and accommodates the substrate holding unit.

With this arrangement, the annular downward gas current is produced around the shield member in a space of the treatment chamber outside the treatment cup. Thus, the downward gas current is substantially free from interference with the shield member. This suppresses the convection of the atmosphere in the space of the treatment chamber outside the treatment cup, thereby stabilizing the gas current in this space.

The foregoing and other objects, features and effects of the present invention will become more apparent from the following detailed description of preferred embodiments with reference to the attached drawings.

DETAILED DESCRIPTION OF PREFERRED EMBODIMENTS

Figure 1:
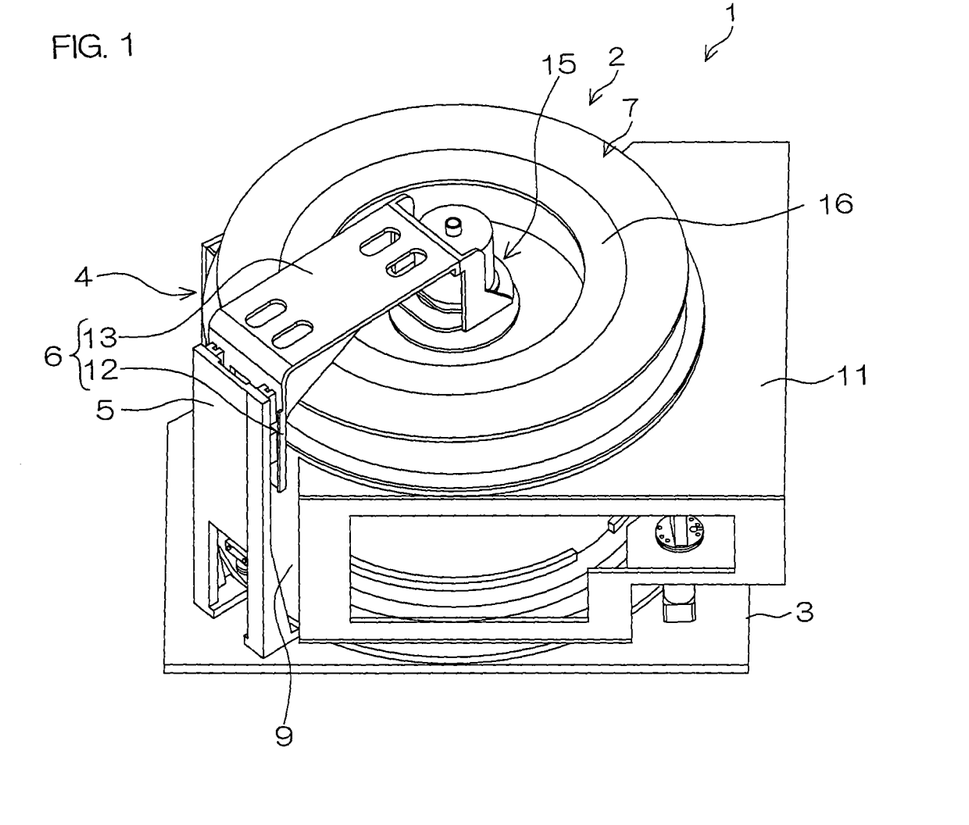
FIG. 1 is a perspective view showing the construction of a substrate treatment apparatus according to one embodiment of the present invention.

FIG. 1 is a perspective view showing the construction of a treatment unit 2 of a substrate treatment apparatus 1 according to one embodiment of the present invention.

The substrate treatment apparatus 1 is of a single substrate treatment type adapted to treat a substrate W with a treatment liquid, and is installed in a clean room. The substrate treatment apparatus 1 includes a treatment unit 2. The treatment unit 2 includes a planar base 3, a treatment chamber 4 fixed onto the base 3, a post (shield member supporting member) 5 fixed onto the base 3 as extending vertically, a lift arm (lift unit) 6 extending generally horizontally above the treatment chamber 4 and movable up and down with respect to the post 5, and a gas supply unit (gas supply portion) 7 attached to an upper portion of the treatment chamber 4. The treatment chamber 4 includes a cylindrical partition wall 9 having a hollow cylindrical shape and defining a treatment area 8 (see FIGS. 2 and 3) in which the substrate W is treated, and a case body 11 having an L-shape as seen in plan and defining a nozzle accommodation area 10 (see FIGS. 2 and 3) in which an upper surface nozzle 18 (see FIGS. 2 and 3) is accommodated.

The lift arm 6 includes a vertical portion 12 supported by the post 5, and a horizontal portion 13 extending horizontally from an upper end of the vertical portion 12. A shield plate (shield member) 14 (see FIGS. 2 and 3) to be accommodated in the treatment chamber 4 is attached to a distal end of the horizontal portion 13 via a holder 15 (see FIGS. 2 and 3). A ceiling wall 16 of the treatment chamber 4 has a horizontal annular shape. The holder 15 is inserted inward of the ceiling wall 16, and supports the shield plate 14 in the treatment chamber 4. In FIG. 1, the treatment chamber 4 is illustrated with a part (a front face in FIG. 1) of the partition wall being open.

Figure 2:
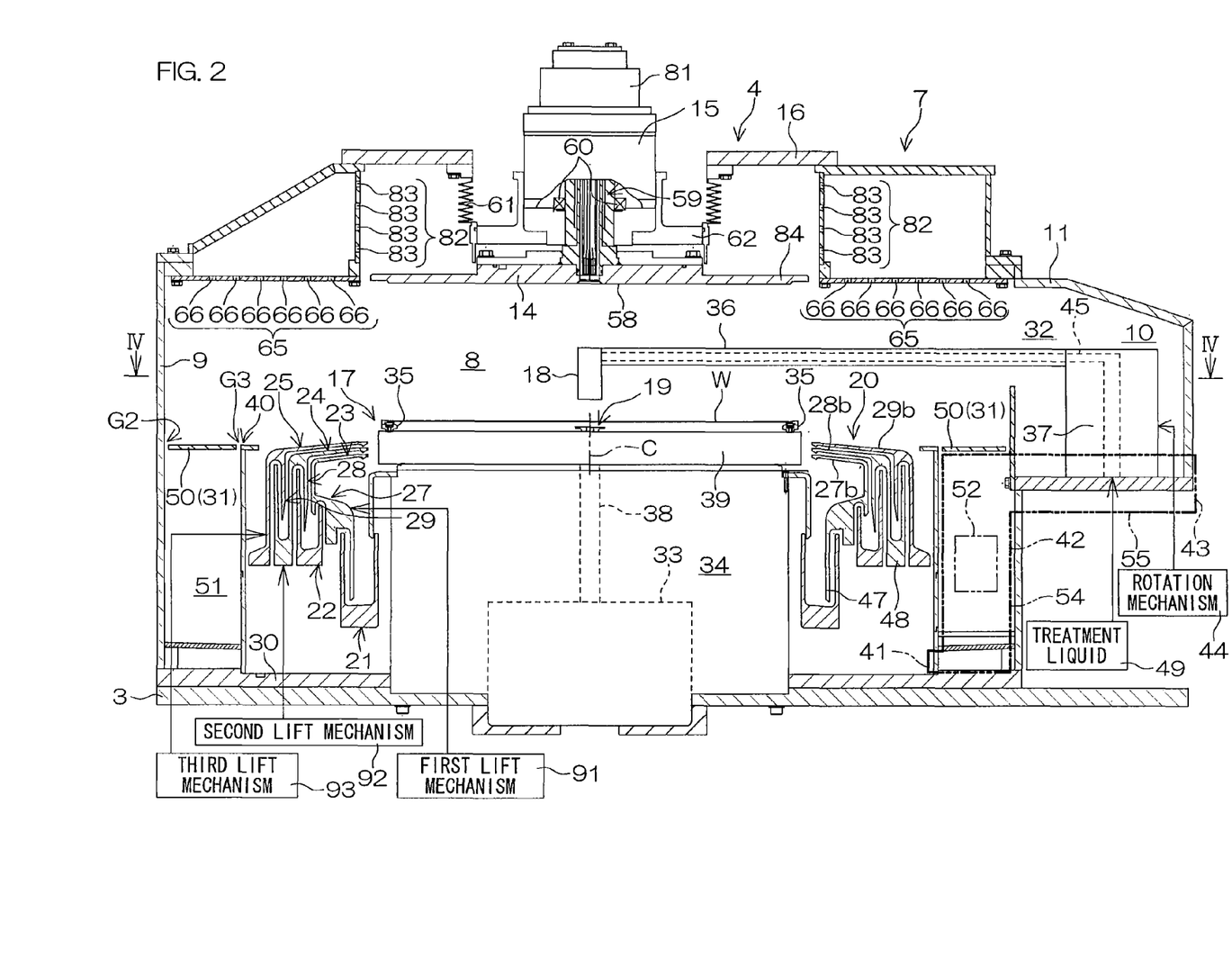
FIG. 2 is a vertical sectional view showing the structure of a treatment chamber shown in FIG. 1.
Figure 3:
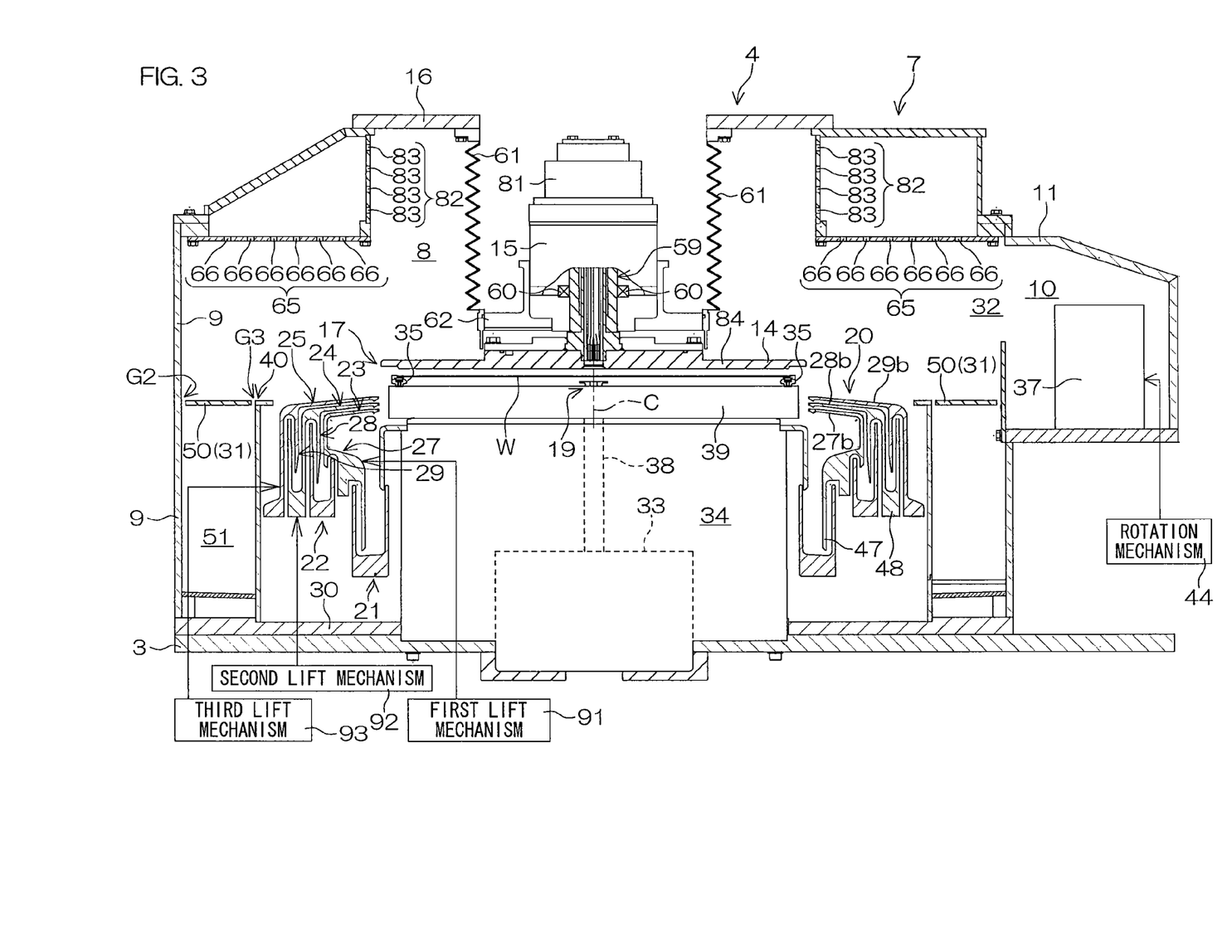
FIG. 3 is a vertical sectional view showing the internal structure of the treatment chamber with a shield plate being located at a treatment position.
Figure 4:
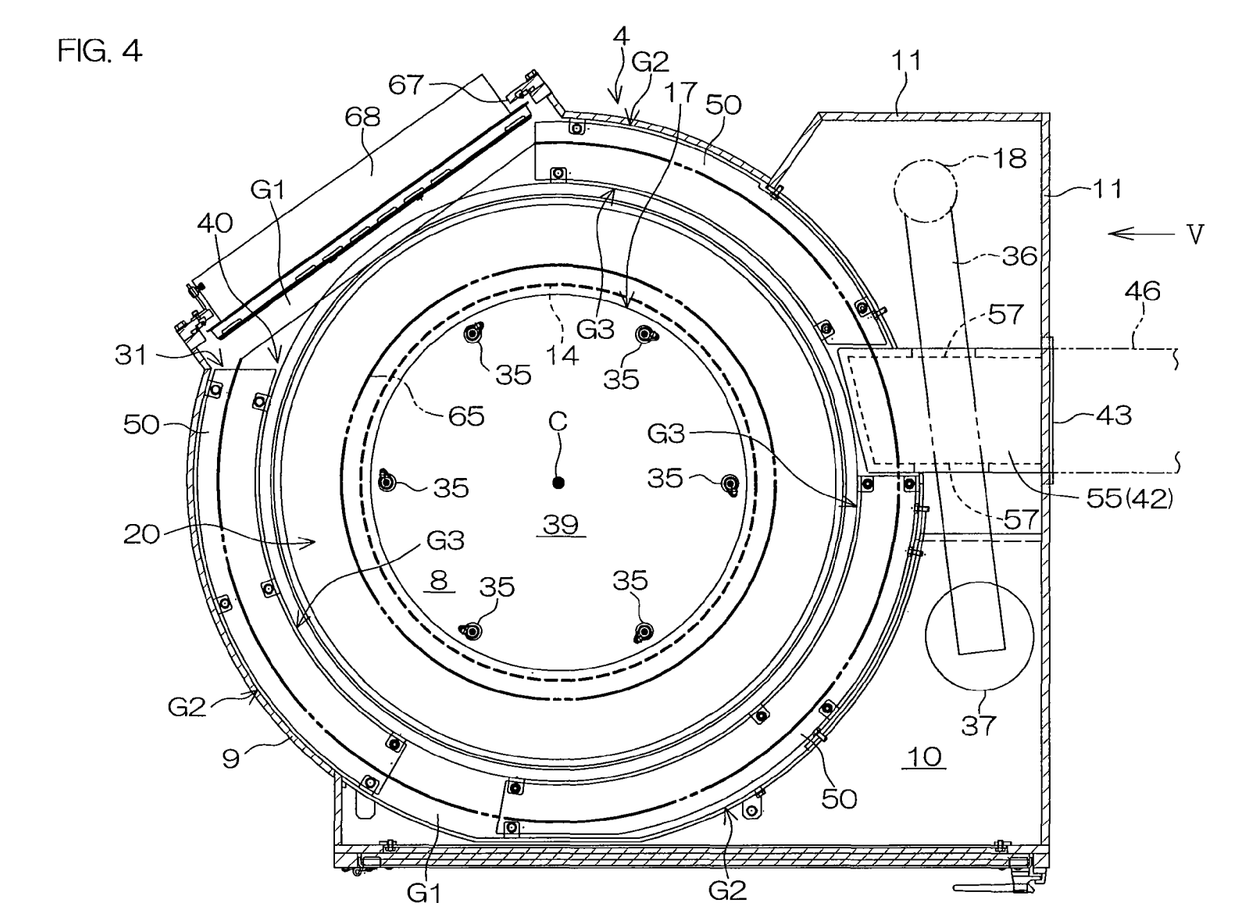
FIG. 4 is a sectional view taken along a section line IV-IV and seen in an arrow direction in FIG. 2.
Figure 5:
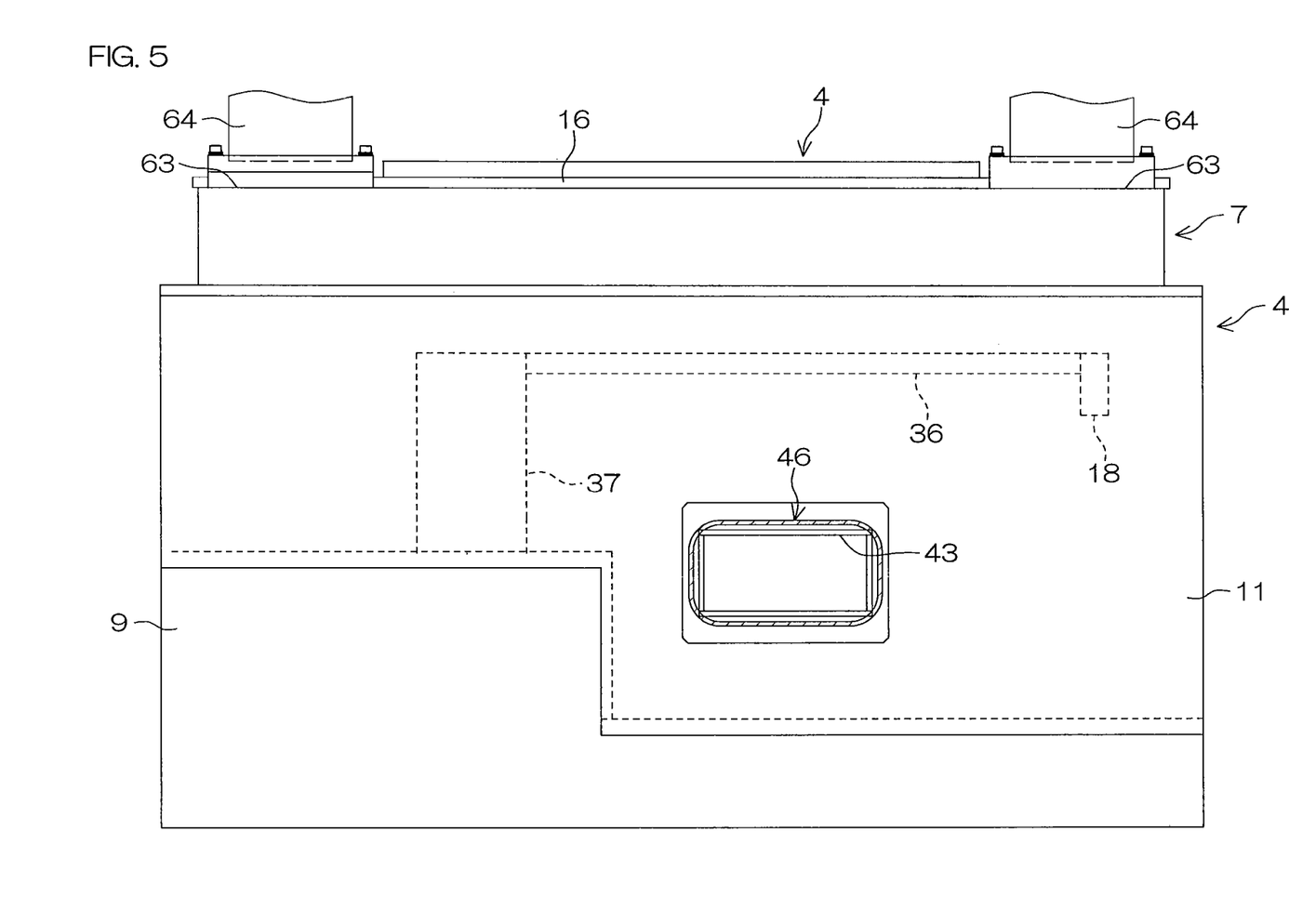
FIG. 5 is a view as seen in an arrow direction V in FIG. 4.

FIGS. 2 and 3 are vertical sectional views showing the internal structure of the treatment chamber 4. FIG. 4 is a sectional view taken along a section line IV-IV and seen in an arrow direction in FIG. 2. FIG. 5 is a view as seen in an arrow direction V in FIG. 4.

A spin chuck (substrate holding unit) 17 which horizontally holds and rotates the substrate W, the upper surface nozzle 18 which supplies the treatment liquid to an upper surface of the substrate W held by the spin chuck 17, a lower surface nozzle 19 which supplies the treatment liquid to a lower surface of the substrate W held by the spin chuck 17, a bottomed tubular treatment cup 20 in which the spin chuck 17 is accommodated, and the disk-shaped shield plate (shield member) 14 disposed above the spin chuck 17 are accommodated in the treatment chamber 4.

The cylindrical partition wall 9 has a cylindrical inner surface having a center axis defined by a rotation axis (vertical axis) C of the substrate W to be rotated by the spin chuck 17. The cylindrical partition wall 9 is connected to the horizontal ceiling wall 16 via the gas supply unit 7. The cylindrical partition wall 9 has a lower edge connected to a bottom wall 30 opposed to the ceiling wall 16. The treatment area 8 is a generally cylindrical space defined by the cylindrical partition wall 9, an outer surface of the gas supply unit 7, the ceiling wall 16 and the bottom wall 30. The spin chuck 17 and the treatment cup 20 are disposed in the treatment area 8. A partition plate 31 is disposed around the treatment cup 20 in the treatment chamber 4 to vertically divide a space of the treatment chamber 4 (treatment area 8) outside the treatment cup 20.

The cylindrical partition wall 9 has a communication opening 32 provided adjacent the nozzle accommodation area 10 to permit communication between the treatment area 8 and the nozzle accommodation area 10. When the treatment is performed with the use of the upper surface nozzle 18, the upper surface nozzle 18 extends through the communication opening 32 from the nozzle accommodation area 10, and a distal end of the upper surface nozzle 18 is disposed above the spin chuck 17.

The spin chuck 17 includes a disk-shaped spin base 39 horizontally fixed to an upper end of a vertical rotation shaft 38, a spin motor 33 disposed below the spin base 39 for driving the rotation shaft 38, and a tubular cover member 34 surrounding the spin motor 33. The spin base 39 has an outer diameter that is slightly greater than the outer diameter of the substrate W held by the spin chuck 17. A plurality of holder members (e.g., six holder members, two of which are shown in FIGS. 2 and 3) are properly angularly spaced from each other on a circle corresponding to the outer periphery of the substrate W in a peripheral portion of an upper surface of the spin base 39. The cover member 34 is fixed to the base 3, and its upper end is located adjacent the spin base 39. The spin chuck 17 horizontally holds the substrate W above the spin base 39 with its holder members 35 in abutment against a peripheral surface of the substrate W. With the substrate W being held by the holder members 35, the rotative driving force of the spin motor 33 is inputted to the rotation shaft 38, whereby the substrate W is rotated about the vertical rotation axis C extending through the center of the substrate W.

The upper surface nozzle 18 is located at a higher level than the substrate W held by the spin chuck 17. The upper surface nozzle 18 is attached to a distal end of a generally horizontal nozzle arm 36. The nozzle arm 36 is supported by an arm support shaft 37 extending generally vertically on a lateral side of the nozzle accommodation area 10. A rotation mechanism 44 such as a motor is connected to the arm support shaft 37. The arm support shaft 37 is rotated by a rotative driving force inputted from the rotation mechanism 44 to the arm support shaft 37, whereby the upper surface nozzle 18 is swung over the upper surface of the substrate W. The treatment liquid is supplied into the upper surface nozzle 18 from a treatment liquid supply source 49 through a treatment liquid supply pipe 45 extending through the arm support shaft 37 and the nozzle arm 36. In a state shown in FIG. 2 (in which the substrate W is treated with the use of the upper surface nozzle 18), the treatment liquid is spouted from the upper surface nozzle 18 and applied onto a center portion of the upper surface of the substrate W held by the spin chuck 17. In FIG. 2, the upper nozzle 18 is illustrated as being located above the substrate W held by the spin chuck 17. FIG. 3 shows a state in which the upper surface nozzle 18 is accommodated in the nozzle accommodation area 10. In FIGS. 3 and 4, the upper surface nozzle 18 is not shown.

The lower surface nozzle 19 is located at a lower level than the substrate W held by the spin chuck 17. The lower surface nozzle 19 is configured such that its spout is opposed to a center portion of the lower surface of the substrate W held by the spin chuck 17. A treatment liquid supply pipe (not shown) is connected to the lower surface nozzle 19, and the treatment liquid is supplied into the lower surface nozzle 19 from the treatment liquid supply source 49 through the treatment liquid supply pipe (not shown). The treatment liquid is spouted from the lower surface nozzle 19 and applied onto the center portion of the lower surface of the substrate W.

The treatment cup 20 includes a hollow cylindrical vent container 40 provided in the treatment chamber 4, a plurality of cups (a first cup 21 and a second cup 22 in this embodiment) provided in the vent container 40, and a plurality of guards (a first guard 23, a second guard 24 and a third guard 25 in this embodiment) provided in the vent container 40. The first, second and third guards 23, 24, 25 have tubular first, second and third guide portions 27, 28, 29, respectively. The treatment cup 20 is configured such that the treatment liquid scattered around the substrate W is received and captured by the respective guide portions 27 to 29, and the treatment liquid received by the guide portions 27 to 29 are drained or recovered.

The vent container 40 surrounds the spin chuck 17. The vent container 40 is capable of retaining the treatment liquid therein. The treatment liquid retained in the vent container 40 is guided into a drain mechanism (not shown). The vent container 40 has a first gas outlet connection port 41 provided in a circumferentially predetermined position of a lower end portion thereof as indicated by a bold two-dot-and-dash line in FIG. 2. The first gas outlet connection port 41 is connected to an upstream end of an in-cup gas outlet duct 42 as indicated by the two-dot-and-dash line in FIG. 2. A downstream end of the in-cup gas outlet duct 42 is connected to a second gas outlet connection port 43 (see FIGS. 4 and 5) provided in a sidewall of the case body 11. The second gas outlet connection port 43 has a horizontally elongated rectangular shape. A gas outlet pipe 46 (see FIGS. 4 and 5) connected at its downstream end to a gas vent facility (not shown) provided in a plant is connected at its upstream end to the second gas outlet connection port 43. The internal atmosphere of the vent container 40 is vented through the first gas outlet connection port 41, the in-cup gas outlet duct 42, the second gas outlet connection port 43 and the gas outlet pipe 46 by the gas vent facility.

At least during the treatment of the substrate W in the treatment chamber 4, preferably even during a period in which the substrate W is not treated, the ventilation of the treatment cup 20 is constantly carried out. In general, the gas vent facility provided in the plant has a limitation in gas venting capability.

The first cup 21 has a shape generally rotationally symmetrical about the rotation axis C of the substrate W to be rotated by the spin chuck 17. The first cup 21 surrounds the spin chuck 17. The first cup 21 is supported at a fixed position in the vent container 40 by a support member (not shown). The first cup 21 has a U-shaped cross section, and defines a drain channel for collecting and draining the treatment liquid used for the treatment of the substrate W.

The second cup 22 has a shape generally rotationally symmetrical about the rotation axis C of the substrate W to be rotated by the spin chuck 17. The second cup 22 is disposed outward of the first cup 21 as surrounding the spin chuck 17. The second cup 22 is supported at a fixed position in the vent container 40 by a support member (not shown). The second cup 22 has a U-shaped cross section, and defines an inner recovery channel for collecting and recovering the treatment liquid used for the treatment of the substrate W. The treatment liquid collected in the inner recovery channel is guided into a recovery mechanism (not shown).

The first guard 23 has a shape generally rotationally symmetrical about the rotation axis C of the substrate W to be rotated by the spin chuck 17. The first guard 23 surrounds the spin chuck 17. The first guard 23 includes the generally tubular first guide portion 27, and a hollow cylindrical treatment liquid separation wall 47 extending vertically downward from the first guide portion 27 and located above the inner recovery channel.

The second guard 24 has a shape generally rotationally symmetrical about the rotation axis C of the substrate W to be rotated by the spin chuck 17. The second guard 24 surrounds the spin chuck 17. The second guard 24 includes the tubular second guide portion 28, and a cup portion 48 continuously extending from the second guide portion 28 and disposed outward of the second guide portion 28. The cup portion 48 has a U-shaped cross section, and defines an outer recovery channel for collecting and recovering the treatment liquid used for the treatment of the substrate W. The treatment liquid collected in the outer recovery channel is guided into the recovery mechanism (not shown).

The third guard 25 has a shape generally rotationally symmetrical about the rotation axis C of the substrate W to be rotated by the spin chuck 17. The third guard 25 surrounds the spin chuck 17. The third guard 25 includes the tubular third guide portion 29.

The three guide portions 27, 28, 29 respectively have upper edge portions 27b, 28b, 29b, which extend obliquely upward toward the rotation axis C of the substrate W. The upper edge portions 27b, 28b, 29b of the first, second and third guide portions 27, 28, 29 are arranged in this order from the lower side in vertically overlapping relation. The three guards 23 to 25 are coaxial with the three guide portions 27 to 29.

The substrate treatment apparatus 1 further includes a first lift mechanism 91 for moving up and down the first guard 23, a second lift mechanism 92 for moving up and down the second guard 24, and a third lift mechanism 93 for moving up and down the third guard 25. The three guards 23 to 25 are independently movable up and down. The guards 23 to 25 are movable up and down between an upper position at which upper edges of the guide portions 27 to 29 of the guards 23 to 25 are each located at a higher level than the substrate W held by the spin chuck 17 and a lower position at which the upper edges of the guide portions 27 to 29 of the guards 23 to 25 are each located at a lower level than the substrate W held by the spin chuck 17.

With the vent container 40 evacuated (i.e., with the vent container 40 kept at a reduced pressure), the positional relationship of the guards 23 to 25 may be such that: all the guards 23 to 25 are located at the lower position; only the third guard 25 is located at the upper position, and the first guard 23 and the second guard 24 are located at the lower position; the second guard 24 and the third guard 25 are located at the upper position, and only the first guard 23 is located at the lower position; or all the guards 23 to 25 are located at the upper position. In any of these cases, the internal atmosphere of the treatment chamber 4 can be introduced into the vent container 40.

The partition plate 31 is horizontally located at the same level as the upper edge of the sidewall of the vent container 40 to surround the vent container 40. More specifically, as shown in FIG. 4, the partition plate 31 is configured such that three C-shaped plate members 50 as seen in plan are arranged circumferentially as being spaced from each other with predetermined gaps G1 (see FIG. 4). The plate members 50 each have an arcuate outer peripheral edge fitted along an inner peripheral surface of the cylindrical partition wall 9. Further, the plate members 50 each have an arcuate inner peripheral edge fitted along an outer peripheral surface of the treatment cup 20 (an outer peripheral surface of the cylindrical vent container 40).

The outer peripheral edges of the respective plate members 50 are spaced from the inner peripheral surface of the cylindrical partition wall 9 with gaps G2 (see FIGS. 2 to 4). The inner peripheral edges of the respective plate members 50 are spaced from the outer peripheral surface of the treatment cup 20 (the outer peripheral surface of the vent container 40) with gaps G3 (see FIGS. 2 to 4).

A space 51 below the partition plate 31 (hereinafter referred to as "lower space 51") communicates with a space above the partition plate 31 through the gaps G1, G2, G3. As shown in FIG. 4, the lower space 51 is present in substantially the entire circumferential region of the treatment chamber 4 except for the in-cup gas outlet duct 42. That is, the lower space 51 is a generally annular space.

A first communication hole 52 is provided in a middle portion of the in-cup gas outlet duct 42 for communication between the in-cup gas outlet duct 42 and the lower space 51. The lower space 51 communicates with the gas outlet pipe 46 through the first communication hole 52, the in-cup gas outlet duct 42 and the second gas outlet connection port 43. Therefore, the internal atmosphere of the lower space 51 is vented by the gas venting capability of the gas vent facility (not shown). The internal atmosphere of the treatment chamber 4 is introduced into the lower space 51 through the gaps G1, G2, G3. That is, the gaps G1, G2, G3 collectively serve as a gas outlet port for introducing the internal atmosphere of the treatment chamber 4 into the gas outlet pipe 46. The gas outlet port defined by the gaps G1, G2, G3 has a generally annular shape to surround the spin chuck 17.

The in-cup gas outlet duct 42 includes a vertical portion 54 mainly extending vertically as indicated by the two-dot-and-dash line in FIG. 2, and a horizontal portion 55 mainly extending horizontally continuously from the vertical portion 54 as indicated by the two-dot-and-dash line in FIG. 2 (see FIGS. 2 and 4). The vertical portion 54 defines an upstream portion of the in-cup gas outlet duct 42, while the horizontal portion 55 defines a downstream portion of the in-cup gas outlet duct 42. The first communication hole 52 is provided in the vertical portion 54 of the in-cup gas outlet duct 42. Two second communication holes 57 (see FIG. 4) are provided in a middle portion of the horizontal portion 55 for communication between the in-cup gas outlet duct 42 and the nozzle accommodation area 10.

Therefore, the nozzle accommodation area 10 communicates with the gas outlet pipe 46 through the second communication holes 57, the in-cup gas outlet duct 42 and the second gas outlet connection port 43. The internal atmosphere of the nozzle accommodation area 10 is vented by the gas venting capability of the gas vent facility (not shown). Thus, the upper surface nozzle 18 to be accommodated in the nozzle accommodation area 10 can be kept clean.

With reference to FIGS. 2 and 3, the shield plate 14 will be described. The shield plate 14 has a disk shape having substantially the same diameter as the substrate W held by the spin chuck 17. A lower surface of the shield plate 14 serves as a substrate opposing surface (opposing surface) 58 to be brought into opposed relation to the front surface of the substrate W held by the spin chuck 17. A rotation shaft 59 aligning with the rotation axis C of the spin chuck 17 is fixed to an upper surface of the shield plate 14. The rotation shaft 59 is rotatably supported in the hollow cylindrical holder 15 attached to (supported by) the distal end of the lift arm 6 via a pair of bearings 60 and the like. The holder 15 extends into the treatment chamber 4 through a space defined by an inner periphery of the ceiling wall 16.

A rotative driving force of a shield plate rotation motor 81 connected to an upper end of the holder 15 is inputted to the rotation shaft 59. The rotation shaft 59 has a hollow inside, and a DIW nozzle for supplying DIW (deionized water) onto the front surface of the substrate W held by the spin chuck 17 is inserted through the inside of the rotation shaft 59. The DIW nozzle has a DIW spout for spouting the DIW toward the rotation center of the front surface of the substrate W held by the spin chuck 17. A nitrogen gas flow passage for supplying nitrogen gas as an inert gas toward the center portion of the substrate W is defined between an interior wall of the rotation shaft 59 and an exterior wall of the DIW nozzle. The nitrogen gas flow passage has a nitrogen gas spout (inert gas spout) which opens in the substrate opposing surface 58.

The lift arm 6 is moved up and down by rotatively driving a lift motor 80 (see FIGS. 6A and 6B), whereby the shield plate 14 is moved up and down between a treatment position (see FIG. 3) at which the shield plate 14 is opposed to and spaced a minute distance from the front surface of the substrate W held by the spin chuck 17 and a spaced-apart position (see FIG. 2) at which the shield plate 14 is spaced upward apart from the surface of the spin chuck 17. Therefore, the shield plate 14 is located at the treatment position when the substrate W is treated with the use of the shield plate 14. When the substrate W is not treated with the use of the shield plate 14, the shield plate 14 is located at the spaced-apart position.

The periphery of the holder 15 is covered with a bellows 61. The bellows 61 is vertically stretchable. An upper end of the bellows 61 is fixed to a lower surface portion of the ceiling wall 16 around the inner periphery of the ceiling wall 16. A lower end of the bellows 61 is fixed to a flange 62 provided at a lower end of the holder 15. When the shield plate 14 is moved up and down, the bellows 61 is correspondingly shortened and elongated. With the shield plate 14 located at the spaced-apart position as shown in FIG. 2, the bellows 61 is in a shortened state. With the shield plate 14 located at the treatment position as shown in FIG. 3, the bellows 61 is in an elongated state. Even if the internal atmosphere of the treatment chamber 4 contains the mist of the treatment liquid, the holder 15 covered with the bellows 61 is prevented from being adversely affected by the atmosphere irrespective of the position (the treatment position or the spaced-apart position) of the shield plate 14.

In this embodiment, a gas supply port for introducing clean air into the treatment chamber 4 is not provided in the ceiling wall 16. This permits the holder 15 to extend through the ceiling wall 16, so that the shield plate 14 can be supported by the post 5 disposed outside the treatment chamber 4. In this case, the lift arm 6 supporting the shield plate 14 can be located outside the treatment chamber 4, thereby permitting size reduction of the treatment chamber 4.

The gas supply unit 7 is adapted to introduce the clean air into the treatment chamber 4. The gas supply unit 7 has an annular plan shape to surround the holder 15 which holds the shield plate 14. A section of the gas supply unit 7 taken along a center axis of the gas supply unit 7 is rectangular (see the sectional shape of a right portion of the gas supply unit 7 in FIGS. 2 and 3). The gas supply unit 7 has a rectangular sectional shape at any location along substantially the entire circumference thereof. However, an upper wall portion of the gas supply unit 7 adjacent to the lift arm 6 is inclined downward radially outward for prevention of interference between the lift arm 6 and the gas supply unit 7 (see the sectional shape of a left portion of the gas supply unit 7 in FIGS. 2 and 3).

The gas supply unit 7 has a plurality of gas supply connection ports 63 (e.g., two gas supply connection ports 63 as shown in FIG. 5, but not shown in FIG. 1) provided in an upper wall thereof. Distal ends of gas supply pipes 64 through which clean air is supplied from a clean air supply source are respectively connected to the gas supply connection ports 63. Thus, the clean air is supplied into the gas supply unit 7.

A gas supply port 65 for supplying the clean air from the gas supply unit 7 into the treatment area 8 is provided in a lower wall of the gas supply unit 7. The gas supply port 65 is a downward gas supply port, and has an annular plan shape to surround the shield plate 14 as indicated by bold two-dot-and-dash lines in FIG. 4.

The gas supply port 65 may include a multiplicity of through-holes 66 each extending vertically through the lower wall of the gas supply unit 7 between upper and lower surfaces of the lower wall of the gas supply unit 7, or a multiplicity of annular slits each extending vertically through the lower wall of the gas supply unit 7 between the upper and lower surfaces of the lower wall of the gas supply unit 7. Alternatively, the gas supply port 65 may be an annular opening provided in the lower wall of the gas supply unit 7. In this case, a filter may be disposed in the opening. The gas supply unit 7 may have a non-box shape, and may have an entirely open lower face, which functions as the gas supply port 65.

In this embodiment, the gas supply port 65 including the multiplicity of through-holes 66 will be described by way of example.

The gas supply port 65 has a round inner periphery that has a diameter greater than the outer diameter of the shield plate 14 as seen in plan (more specifically, the inner diameter of a cylindrical inner peripheral surface of the gas supply unit 7 is slightly greater than the outer diameter of the shield plate 14). The gas supply port 65 has an outer periphery that has a diameter slightly smaller than the outer diameter of the partition wall (cylindrical partition wall 9) of the treatment chamber 4. Therefore, as shown in FIG. 4, the gas supply port 65 is annular with round inner and outer peripheries as seen in plan.

That is, the gas supply port 65 and the gas outlet port (defined by the gaps G1, G2, G3) each have a generally annular shape. In addition, as shown in FIG. 4, the gas supply port 65 and the gas outlet port overlap each other as seen in plan. Therefore, an annular downward gas current is stably produced in the treatment chamber. Therefore, the downward gas current is substantially free from interference with the shield plate 14.

The gas supply port 65 is located in substantially the same horizontal plane as the substrate opposing surface 58 of the shield plate 14 located at the spaced-apart position as shown in FIG. 2. When the front surface of the substrate W is treated with the use of the shield plate 14, the shield plate 14 can be located at the treatment position. When the front surface of the substrate W is not treated with the use of the shield plate 14, the shield plate 14 can be located at the spaced-apart position. With the shield plate 14 located at the spaced-apart position, the substrate opposing surface 58 of the shield plate 14 is present in the same plane as the gas supply port 65, so that the clean air supplied into the treatment chamber 4 from the gas supply port 65 is free from interference with the shield plate 14.

As shown in FIGS. 2 and 3, the gas supply unit 7 may have a horizontal gas supply port 82 provided in an inner peripheral wall thereof. More specifically, the gas supply unit 7 may have a multiplicity of through-holes 83 extending horizontally through the inner peripheral wall thereof. In this case, the clean air supplied into the gas supply unit 7 partly flows out toward the bellows 61 from the gas supply port 82, and then flows down along the bellows 61 to form a gas current flowing on an upper surface 84 of the shield plate 14. This gas current is combined with the downward gas current supplied from the gas supply port 65. This arrangement makes it possible to produce the clean air current in a space around the bellows 61, i.e., in an upper space above the upper surface 84 of the shield plate 14, thereby substantially preventing the atmosphere containing the mist of the treatment liquid from intruding into the upper space above the upper surface 84 of the shield plate 14.

The treatment chamber 4 has an opening 67 (see FIG. 4) provided in the cylindrical partition wall 9 thereof for loading and unloading the substrate W with respect to the treatment chamber 4. A robot arm (not shown) which causes its hands to access the treatment chamber 4 through the opening 67 for the loading and unloading of the substrate W is provided outside the treatment chamber 4. A shutter 68 for covering and uncovering the opening 67 is provided in association with the opening 67 outside the treatment chamber 4. The shutter 68 is vertically openable.

Figure 6A:
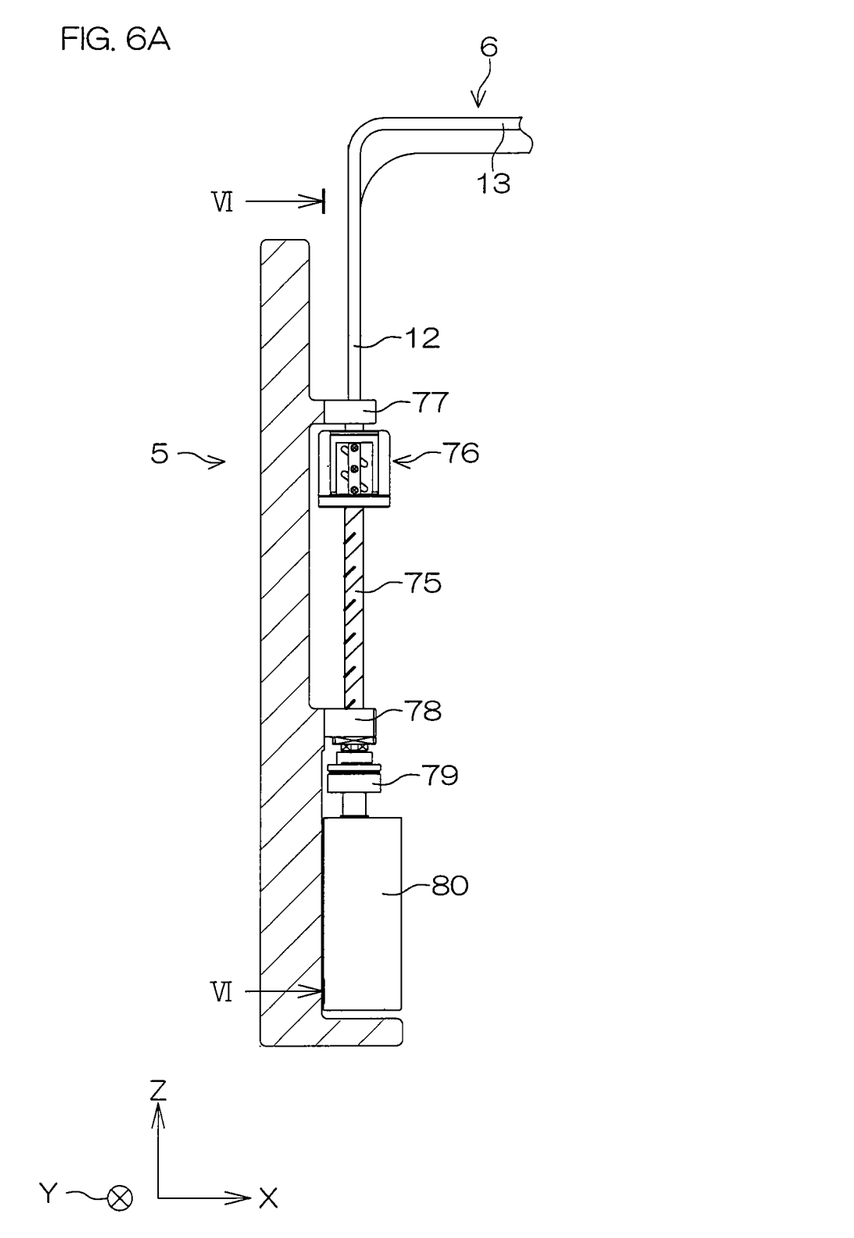
FIG. 6A is a sectional view showing the structures of a post and a lift arm shown in FIG. 1.
Figure 6B:
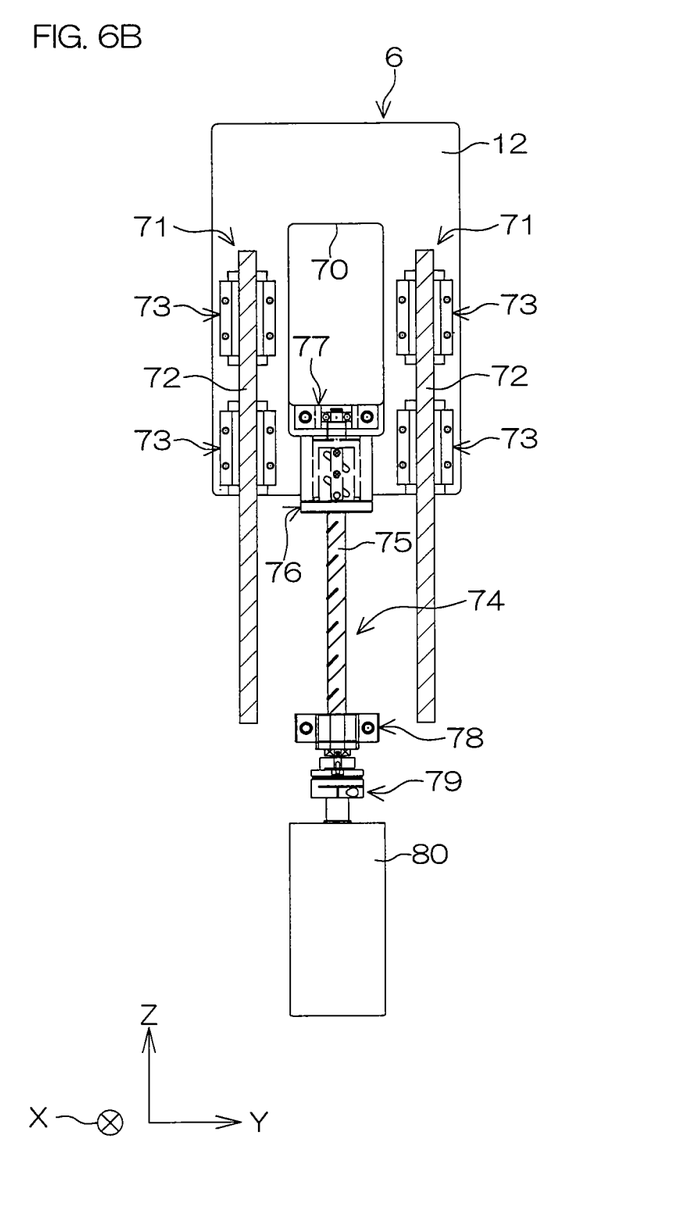
FIG. 6B is a sectional view taken along a section line VI-VI and seen in an arrow direction in FIG. 6A.

FIG. 6A is a sectional view showing the structures of the post 5 and the lift arm 6. FIG. 6B is a sectional view taken along a section line VI-VI and seen in an arrow direction in FIG. 6A.

The post 5 is a vertically elongated plate which extends vertically (in a Z-direction). The vertical portion 12 of the lift arm 6 is a plate which is elongated vertically (in the Z direction). The vertical portion 12 has an opening 70 formed in a middle portion thereof. The post 5 and the vertical portion 12 are disposed with their surfaces opposed to each other. In FIGS. 6A and 6B, an X-direction is a horizontal direction extending toward the cylindrical partition wall 9 of the treatment chamber 4 from the post 5 and the vertical portion 12. A Y-direction is a horizontal direction perpendicular to the X-direction.

A pair of linear guides 71 (not shown in FIG. 6A, but shown in FIG. 6B) are provided between the post 5 and the vertical portion 12. The linear guides 71 each include a vertically extending rail 72, and two guides 73 engaged with the rail 72. The rails 72 of the respective linear guides 71 are fixed to a surface of the post 5 facing in the X-direction, and the guides 73 are fixed to a surface of the vertical portion 12 facing in a direction opposite to the X-direction in opposed relation to the surface of the post 5. The two rails 72 are disposed in widthwise opposite edge portions of the post 5 (with respect to the Y-direction). With the provision of the linear guides 71, the vertical portion 12 of the lift arm 6 is vertically movable with respect to the post 5. A ball thread mechanism 74 is provided between the paired rails 72.

The ball thread mechanism 74 includes a thread shaft 75 vertically supported by the post 5, and a cylindrical ball nut 76 threadingly engaged with the thread shaft 75. The thread shaft 75 is rotatably supported by the post 5. A pair of upper and lower thread shaft support members 77, 78 which rotatably support the thread shaft 75 with respect to the post 5 are fixed to the surface of the post 5 facing in the X-direction. The upper thread shaft support member 77 rotatably supports an upper end portion of the thread shaft 75 via a bearing (not shown) so as to restrict the upward movement of the thread shaft 75. The lower thread shaft support member 78 rotatably supports a lower end portion of the thread shaft 75 via a bearing (not shown) so as to restrict the downward movement of the thread shaft 75.

The ball nut 76 is connected to the vertical portion 12 of the lift arm 6. When the thread shaft 75 is rotated, the lift arm 6 and the ball nut 76 each maintained in a vertical attitude by the linear guides 71 are not rotated together with the thread shaft 75, but moved axially of the threat shaft 75. Therefore, the lift arm 6 can be vertically moved up and down by rotating the thread shaft 75. A rotative driving force of the lift motor 80 is inputted to the lower end of the thread shaft 75 via a coupling 79. Usable as the lift motor 80 is, for example, a servo motor. The lift motor 33 is fixed to a lower portion of the post 5.

When the lift motor 80 is rotatively driven, the thread shaft 75 is rotated to move up and down the ball nut 76 and the lift arm 6. Thus, the shield plate 14 is moved up and down between the treatment position (see FIG. 3) at which the shield plate 14 is opposed to and spaced the minute distance from the front surface of the substrate W held by the spin chuck 17 and the spaced-apart position (see FIG. 2) at which the shield plate 14 is spaced upward apart from the surface of the spin chuck 17.

According to the embodiment described above, the gas supply port 65 has an annular shape to surround the shield plate 14 as seen in plan. The downward clean air is supplied into the treatment chamber 4 from the gas supply port 65, so that the annular downward gas current surrounding the shield plate 14 is produced in the space of the treatment chamber outside the treatment cup 20. Therefore, the downward gas current is substantially free from interference with the shield plate 14. This suppresses the convection of the atmosphere in the space of the treatment chamber 4 outside the treatment cup 20, thereby stabilizing the gas current. Thus, the internal atmosphere of the treatment chamber 4 can be efficiently vented.

With the shield plate 14 located at the spaced-apart position, particularly, the substrate opposing surface 58 of the shield plate 14 is present in the same plane as the gas outlet port 65, so that the clean air supplied into the treatment chamber 4 from the gas supply port 65 is free from interference with the shield plate 14. Therefore, the gas current can be stabilized in the treatment chamber 4 when the front surface of the substrate W is not treated with the use of the shield plate 14.

While the embodiment of the present invention has thus been described, the invention may be embodied in other ways.

With the shield plate 14 located at the spaced-apart position, the substrate opposing surface 58 of the shield plate 14 is present in the same plane as the gas supply port 65 in the embodiment described above, but may be located at a higher level than the gas supply port 65. Even with this arrangement, the clean air supplied into the treatment chamber 4 from the gas supply port 65 is free from interference with the shield plate 14. Therefore, the gas current can be stabilized in the treatment chamber 4 when the front surface of the substrate W is not treated with the use of the shield plate 14.

In this embodiment, the gas supply unit 7 which supplies the clean air into the treatment chamber 4 from the air supply pipes 64 has been described by way of example, but an FFU (fan filter unit) may be used instead of the gas supply unit 7. The FFU includes a fan and a filter vertically stacked, and is adapted to take in air from the clean room by the fan, clean the air by the filter, and supply the air into the treatment chamber 4 from the gas supply port.

While the present invention has been described in detail by way of the embodiments thereof, it should be understood that the embodiments are merely illustrative of the technical principles of the present invention but not limitative of the invention. The scope of the present invention is to be limited only by the appended claims.

This application corresponds to Japanese Patent Application No. 2009-226263 filed in the Japanese Patent Office on Sep. 30, 2009, the disclosure of which is incorporated herein by reference in its entirety.

What is claimed is:

1. A substrate treatment apparatus comprising:
   a treatment chamber in which a substrate is treated;
   a substrate holder which horizontally holds the substrate with a surface thereof facing upward in the treatment chamber, and rotates the substrate about a rotation axis passing through a center of the substrate;
   a tubular treatment cup which is disposed in the treatment chamber, and surrounds the substrate holder and accommodates the substrate holder in the treatment chamber;
   a shield member disposed above the substrate holder in the treatment chamber and having an opposing surface configured to be brought into opposed relation to the substrate holder;
   a gas supply unit which has a downward gas supply port having an annular shape to surround the shield member when viewed in a direction along the rotation axis and is disposed in an upper portion of the treatment chamber for supplying a gas into the treatment chamber from outside of the treatment chamber, the gas supply port being spaced radially from and not overlapping the shield member when viewed in the direction along the rotation axis;

a shield member lifter that moves the shield member up and down along the rotation axis between a treatment position close to the substrate at a lower portion of the treatment chamber and a spaced-apart position spaced away from the substrate, wherein the gas supply port is kept fixed to the upper portion of the treatment chamber while the shield member lifter moves the shield member, and a vent container which surrounds the treatment cup in the treatment chamber and has a gas outlet port for introducing an internal atmosphere of the treatment chamber into a gas outlet pipe connected to the treatment chamber, wherein the gas supply unit supplies the gas downwardly from the gas supply port toward the gas outlet port, outside the treatment cup, thereby forming a downward gas current in the treatment chamber from an upper area to a lower area thereof.

2. The substrate treatment apparatus according to claim 1, wherein the shield member is supported by a shield member supporting member disposed outside the treatment chamber.

3. The substrate treatment apparatus according to claim 1, wherein the gas supply port and the gas outlet port overlap each other when viewed in the direction along the rotation axis.

4. The substrate treatment apparatus according to claim 1, further comprising a partition plate disposed between an inner surface of the treatment chamber and an outer surface of the vent container so as to partition an upper space and a lower space of the treatment chamber, wherein the gas outlet port includes a first gap defined between the partition plate and the outer surface of the vent container.

5. The substrate treatment apparatus according to claim 4, wherein the substrate treatment apparatus comprises a plurality of the partition plates, and the gas outlet port further includes a second gap defined among the plurality of partition plates.

6. The substrate treatment apparatus according to claim 4, wherein the gas outlet port further includes a third gap defined between the partition plate and the inner surface of the treatment chamber.

7. The substrate treatment apparatus according to claim 1, wherein the downward gas supply port has an inner periphery that has a diameter greater than an outer diameter of the shield member.

8. The substrate treatment apparatus according to claim 1, wherein the opposing surface of the shield member is positioned at a same height as, or higher than, the gas supply port when the shield member is in the spaced-apart position.

* * * * *